United States Patent [19]

Nagase

[11] Patent Number: 4,988,945
[45] Date of Patent: Jan. 29, 1991

[54] OPTICAL AND MAGNETIC ENCODER FOR SERIALLY TRANSMITTING ABSOLUTE POSITION SIGNALS WITH AN AUXILIARY POWER SUPPLY

[75] Inventor: Takashi Nagase, Iramu, Japan

[73] Assignee: Kabushiki Kaisha Yaskawa Denki Seisakusho, Kitakyushu, Japan

[21] Appl. No.: 165,843

[22] Filed: Mar. 9, 1988

[51] Int. Cl.[5] .......................... G01P 3/36; G01D 5/34
[52] U.S. Cl. ................................ 324/175; 324/226; 250/231.13
[58] Field of Search ............... 324/207, 208, 226, 227, 324/262, 166, 175; 205/231 SE; 307/64, 65, 66

[56] References Cited

U.S. PATENT DOCUMENTS

| | | | |
|---|---|---|---|
| 3,189,788 | 6/1965 | Gady | 307/66 |
| 3,461,570 | 2/1972 | Thompson | 307/65 |
| 4,423,958 | 1/1984 | Schmitt | 250/231 SE |
| 4,673,824 | 6/1987 | Pepper | 307/66 |
| 4,705,943 | 11/1987 | Charlton | 250/231 SE |

OTHER PUBLICATIONS

Design Ideas, 2119 EDN, vol. 30 (1985), Jun. 27th, No. 15, Newton, MA, USA, "Capacitor maintains data during power loss", p. 241, Stephen Crum.

Primary Examiner—Walter E. Snow
Attorney, Agent, or Firm—Oblon, Spivak, McClelland, Maier & Neustadt

[57] ABSTRACT

The rotation type absolute encoder of the present invention is constituted by a magnetic type one-pulse encoder for detecting one or more rotations, and an optical type absolute encoder comprising a plural number of aspheric LED lens as a light source, a group of detecting elements corresponding to the area of the light source, a slit disc beginning from the track of two slits, and a differential input type current-to-voltage convertor. This absolute encoder is also so constructed as to back up the circuit voltage by an external battery and an internal large capacitance capacitor when a current is cut, and has a circuit for serially transmitting a signal indicating the number of rotations and the absolute angle to an external controller, and a circuit for synthesizing and outputting one reference pulse per rotation from the signals of the magnetic type one-pulse encoder and the optical type absolute encoder.

6 Claims, 9 Drawing Sheets

OPTICAL AND MAGNETIC ENCODER FOR SERIALLY TRANSMITTING ABSOLUTE POSITION SIGNALS WITH AN AUXILIARY POWER SUPPLY

FIELD OF THE INVENTION

The present invention relates to an absolute encoder of the multirotation type in which a one-pulse encoder of the magnetic type for detecting the number of rotations and the rotating direction and an absolute encoder of the optical type for detecting the absolute angle within one rotation are combined on the same shaft, the absolute angle of the multirotations of the shaft is detected on the basis of detection signals of the encoders, and when power sources which are supplied to the encoders are cut, a power source is supplied from an external auxiliary power source such as a battery power source or the like to the one-pulse encoder and to an electronic circuit to measure the detection amount of the one-pulse encoder.

DESCRIPTION OF THE PRIOR ART

FIG. 10 is a diagram showing a constitution of a conventional example of a kind of multirotation type absolute encoder.

An optical type absolute encoder to detect the absolute angle within one rotation comprises: a disk 2, attached to a shaft 1, for detecting the absolute angle within one rotation; a light emitting section LED $4_0$ to project the light to the disk 2; a light projecting lens 3; a grating 5 and photo sensing devices $6_1$ to $6_{15}$ to detect photosignals; and waveform shaping circuits $7_1$ to $7_{15}$ to shape the waveforms of the detection signals into square waves. A magnetic type one-pulse encoder to detect multirotations comprises: a disk $8_1$ which is attached to the shaft 1 and has a magnet $8_2$ attached to its rotating section; a magnetoresistive element 9 to detect the number of rotations of the disk $8_1$; a waveform shaping circuit 10; and a power switching circuit 11 for switching a power source to an external auxiliary power source such as a battery power source or the like when the supply of the power source is cut. To detect the rotating direction, the magnetic type one-pulse encoder to detect the multirotations outputs square wave signals $M_1$ and $M_2$ of two phases having a phase difference of 90°. The multirotations are detected by counting the signals $M_1$ and $M_2$ by counters (not shown) provided in an external controller. On the other hand, the optical type absolute encoder to detect the absolute angle within one rotation outputs signals $G_1$ to $G_{15}$ (15 bits in the case of detecting 32,768 pulses) in accordance with the resolution and detects the absolute value from these signals.

The foregoing conventional multirotation type absolute encoder has the following problems if it is used as a detector to detect the position of a robot or similar equipment.

(1) Problems regarding the number of signals of an output circuit

An absolute value signal is generally output by a gray code for each bit. However, for example, when detecting fifteen bits (32,768 pulses), it is necessary to use at least twenty electric wires consisting of fifteen output signal lines, two signal lines for the multirotation detection signals, two power source lines, and one battery power source line. Recent multiaxis type robots need up to six detectors for six axes. Therefore, it is necessary to provide at least 120 ($=20\times6$) leading wires for the six detectors. If balanced line driver $16_1$ to $16_5$ as shown in FIG. 12 are used as an output system in order to improve noise resistivity, the number of absolute value detection signals is doubled, so that 210 ($=35\times6$) electric wires are necessary. Consequently, this causes major problems in that the time required to connect the wires to the external controller becomes extremely long, the robot cannot be miniaturized, and reliability cannot be improved.

(2) Problems when the battery power source is cut

It is a feature of conventional multirotation type absolute encoders that, even if a power failure occurs, the position of the encoder which had been rotated many times is retained in a memory by a battery power source. However, if the electric wire for the battery of the external controller is disconnected from the encoder, no power source is supplied, with the result that the multirotations cannot be detected as in the case of a conventional absolute encoder.

(3) Problems regarding the outer diameter dimension

To improve the detecting accuracy of the absolute value, it is necessary to improve the resolution by increasing the number of bits of the absolute encoder. However, to increase the number of bits, it is also necessary to increase the number of tracks of the disk. Therefore, the diameter of the disk and the outer diameter of the absolute encoder increase. It is difficult to miniaturize the encoder.

(4) Problems regarding the length dimension and fluctuation in temperature

The following two kinds of methods can be used as a constituent of the light projecting section of an absolute encoder. In one method, the LED $4_0$ and the collimator lens 3 to convert the light to the parallel light are used as shown in FIG. 10. In the other method, each pair of light emitting devices and photo sensing devices ($4_1$ and $6_1$), ($4_2$ and $6_2$), ..., ($4_{15}$ and $6_{15}$) are used for one bit of the absolute encoder as shown in FIG. 11.

According to the former method, since the light is emitted from a single LED, a change in light quantity on the temperature of the LED exerts an influence on the photo sensing device. Therefore, if the change in light quantity to the temperatue of the LED is detected and controlled, the influence of the temperature can be reduced. However, to cover all of the photo sensing devices, a lens of a large outer diameter is necessary. When using such a large lens, the focal distance of the lens is long, so that the length of the absolute encoder cannot be reduced.

According to the latter method, although the problem of length is eliminated, the temperature changes of each pair of light emitting device and photo sensing device cannot be made constant. The temperature changes of each of the detection signals are variable. It is very difficult to compensate for the temperature changes.

(5) Problems regarding the frequency characteristics

As shown in FIG. 10, in conventional absolute encoders, in the case of fifteen bits, a total of fifteen sets of photo sensing devices $6_1$ to $6_{15}$ and waveform shaping circuits $7_1$ to $7_{15}$ for each bit are necessary. However, since there are variations in light quantities and sensitivities of the photo sensing devices, the frequency characteristics of each of the detection signals do not coincide. When the shaft rotates at a high speed, the phase of the gray code is deviated or the detection signal is cut. To prevent this, the absolute encoder can be used only at a low rotational speed near the stop state. It is difficult to control the absolute encoder by the servo control loop.

Since conventional multirotation absolute encoders have various kinds of problems as described in 1–5 above, it is difficult in practice to manufacture a small-sized multirotation type absolute encoder having a high reliability which is suitable for high speed rotation.

SUMMARY OF THE INVENTION

It is an object of the present invention to provide an absolute encoder of the multirotation type in which the number of electric wires can be greatly reduced, thereby the number of disconnected leading wires and of erroneous connecting wires can be reduced, and reliability improved.

It is another object of the present invention to provide an absolute encoder of the multirotation type in which, even if the power source electric wire is disconnected or removed, the encoder can be driven for, for example, four days or longer, thereby even when a robot is moved due to a change in production line, it can be promptly restarted.

It is still another object of the present invention to provide an absolute encoder of the multirotation type in which the diameter of the disk of the absolute encoder can be reduced, thereby the encoder can be miniaturized.

It is still another object of the present invention to provide an absolute encoder of the multirotation type in which the influence by the temperature fluctuation and the length of encoder can be reduced.

It is still another object of the present invention to provide an absolute encoder of the multirotation type which can also be used at a high speed rotation.

It is still another object of the present invention to provide an absolute encoder of the multirotation type in which the index pulse which is used in a conventional incremental encoder becomes unnecessary.

A multirotation type absolute encoder according to the present invention has: a power source voltage detecting circuit to detect whether the power source voltage has reached a predetermined voltage value when the power source is turned on; and a control circuit for first serially transmitting a signal indicative of the number of multirotations to a external controller when the power source voltage has reached a predetermined voltage or higher and, thereafter, for transmitting a signal indicating the absolute angle within one rotation by use of square wave signals of two phases having a phase difference of 90°.

The multirotation type absolute encoder of the present invention has a high volumed capacitor parallelly connected to a battery power source.

The multirotation type absolute encoder of the present invention is characterized in that a disk of the optical type absolute encoder does not have the minimum slit (MSB) consisting of one slit, code patterns originating from a pattern consisting of two slits are formed and a pulse detected by a magnetic encoder is used as one slit of the minimum slit.

The multirotation type absolute encoder according to the present invention is further characterized in that: slit tracks of a disk of an optical type absolute encoder are divided into a group corresponding to the area to which an LED can emit light; a reference track of only a transparent section is provided in this group; and in the case of converting a detection signal into square waves, the detection signal is converted into the square wave output by use of an output signal of the reference track as a reference.

The multirotation type absolute encoder of the present invention is still further characterized in that a circuit to detect the slit of the maximum resolution is constituted by a differential type current-to-voltage converter.

The multirotation type absolute encoder of the present invention is yet further characterized in that one index pulse is synthesized and output for each rotation from a detection signal of the optical type absolute encoder and from a signal having the maximum resolution which operates as an incremental encoder.

DESCRIPTION OF THE PREFERRED EMBODIMENT

An embodiment of the present invention will be described in detail hereinbelow with reference to the drawings.

Figure 1:
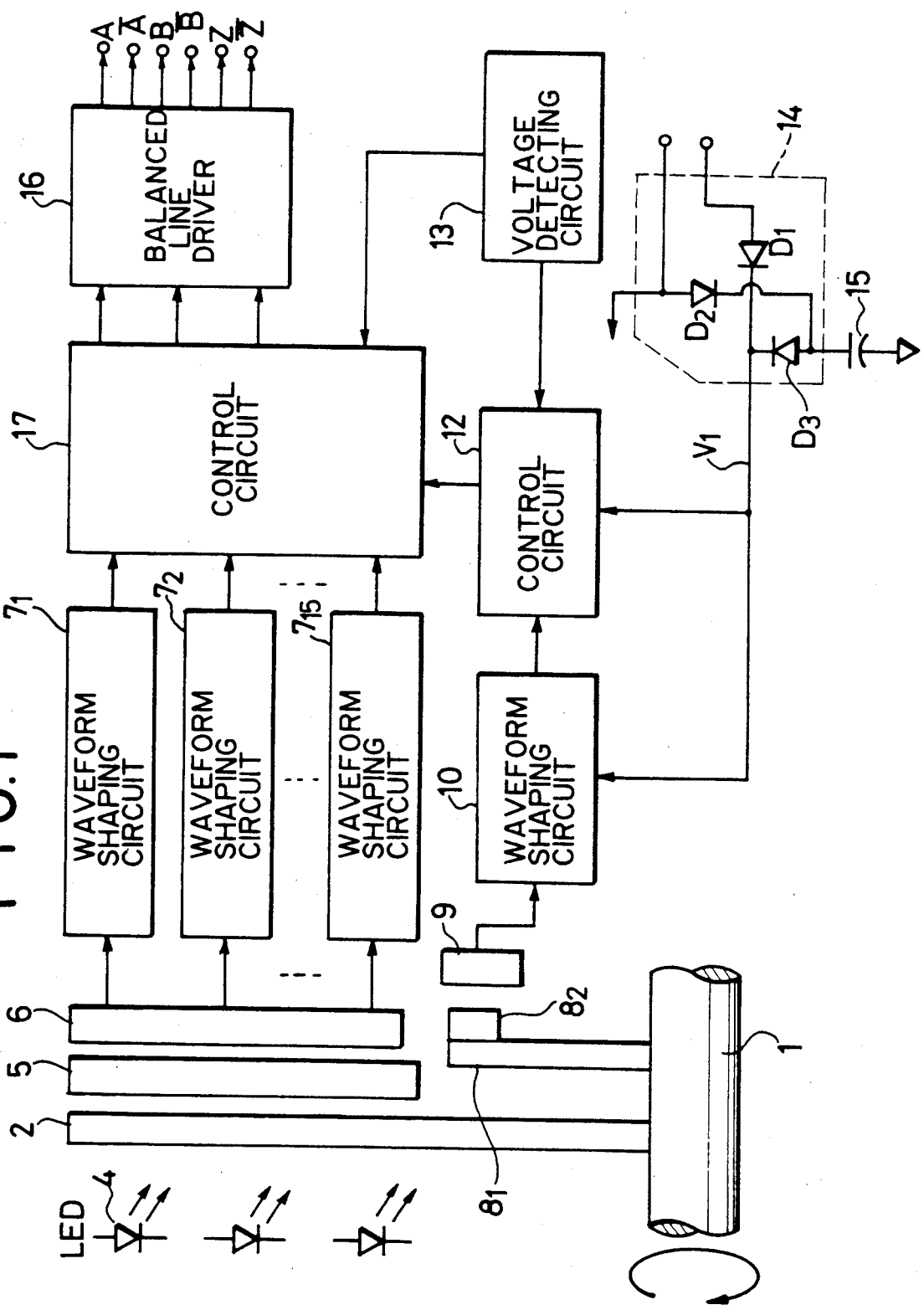
FIG. 1 is a diagram showing a constitution of an embodiment of a multirotation type absolute encoder of the present invention.
Figure 2:
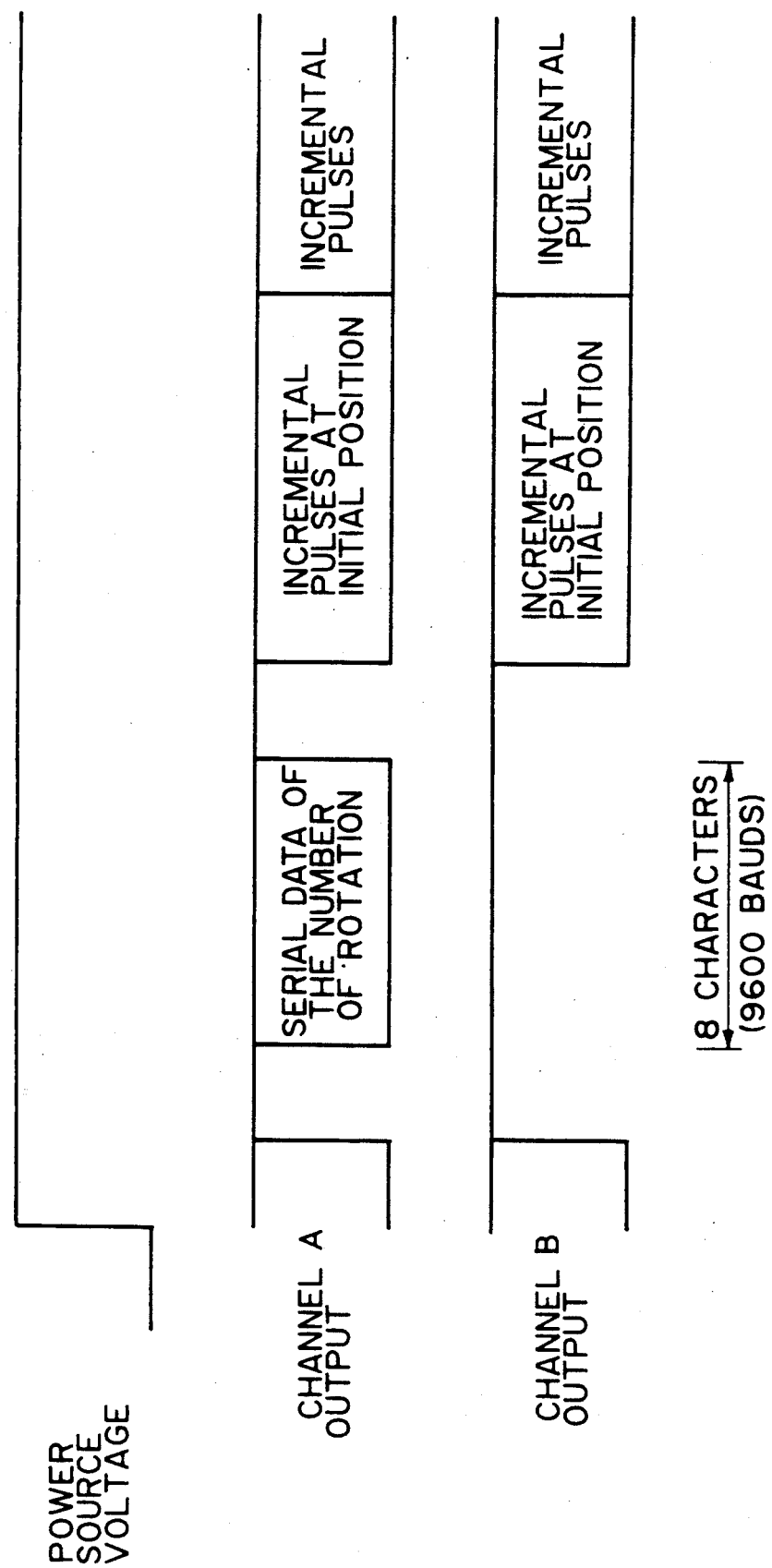
FIG. 2 is a diagram showing signal formats of outputs of channels A and B in the embodiment of FIG. 1.

FIG. 1 is a diagram showing a constitution of an embodiment of a multirotation type absolute encoder of the invention. FIG. 2 is a diagram showing signal formats of outputs of channels A and B in the embodiment of FIG. 1. An optical type absolute encoder to detect the absolute angle within one rotation comprises: a disk 2, attached to a shaft 1, for detecting the absolute angle within one rotation; a LED 4 to emit light to the disk 2; a grating 5; a photodiode array 6 consisting of photo sensing devices; and waveform shaping circuits $7_1$ to $7_{15}$ to shape the waveforms of detection signals of those photo sensing devices into square waves. A magnetic encoder to detect the multirotations comprises: a disk $8_1$ having a magnet $8_2$ attached to the rotating section: a magnetoresistive element 9 to detect the number of rotations; a waveform shaping circuit 10; a power switching circuit 14 for switching the power source to an external battery power source when the supply of the power source is cut; a high volumed capacitor 15 to drive the circuit by the accumulated voltage if the battery power source is cut; a voltage detecting circuit 13 to detect the power source voltage; a control circuit 12 having therein a microcomputer to count detection signals of multirotations and to keep the count value; a control circuit 17 including a gate array for serially transmitting the detection signals of multirotations and the absolute value signal within one rotation as signals of channels A, B, and Z, respectively, after the power source is turned on; and a balanced line driver 16 to send those signals to an external controller.

The operation of the embodiment will now be described.

First, a voltage is supplied from the battery power source to the multirotation type magnetic encoder. This voltage passes through a diode $D_1$ and is supplied as the power source voltage to the magnetic encoder to detect the multirotations, the control circuit 12 having therein a microcomputer for counting a number of multirotation signals and holding them. Even when no power source is supplied (e.g., also including during a power failure), the number of rotations of the shaft 1 is detected.

Next, when the power source voltage is supplied, it is supplied as the power source voltage to each circuit of, for example, an absolute encoder and, at the same time, it is charged into the capacitor 15 by a diode $D_2$. The power source is also supplied to $D_3$. Assuming that the power source voltage is 5 V, the battery power source voltage is 3 V, and the forward voltage drop of each of the diodes $D_1$ to $D_3$ is 0.7 V, the power source voltage $V_1$ which is applied to the magnetic encoder becomes 3.6 V ($=5-0.7\times2$) and is larger than the battery voltage of 3 V. Thus, the diode $D_1$ is set into the reverse bias state. While the power source is being applied, there is no need to supply a current from the battery power source. Thus, the life of the battery is lengthened.

Each section will now be described in detail.

Signal transmission

When the power source voltage is supplied, the voltage detecting circuit 13 operates and sends signals to the control circuits 17 and 12. The control circuit 17 then operates and first transmits the multirotation detection signal of the shaft 1 as a start-stop system signal to the channel A signal and as serial data to the external controller. In this embodiment, this signal is transmitted by the ASCII code (9600 bauds) of eight characters. The absolute value signal which is detected the second time by the absolute encoder is transmitted as incremental pulses of channels A and B to the external controller (FIG. 2). In the external controller, the absolute position of the multirotations can be detected from those two signals. After the transmission, by transmitting the pulses of two phases of channels A and B in a manner similar to the conventional method, the positioning can be performed by an incremental encoder.

Detecting section of the magnetic encoder and the high volumed capacitor 15

Figure 3:
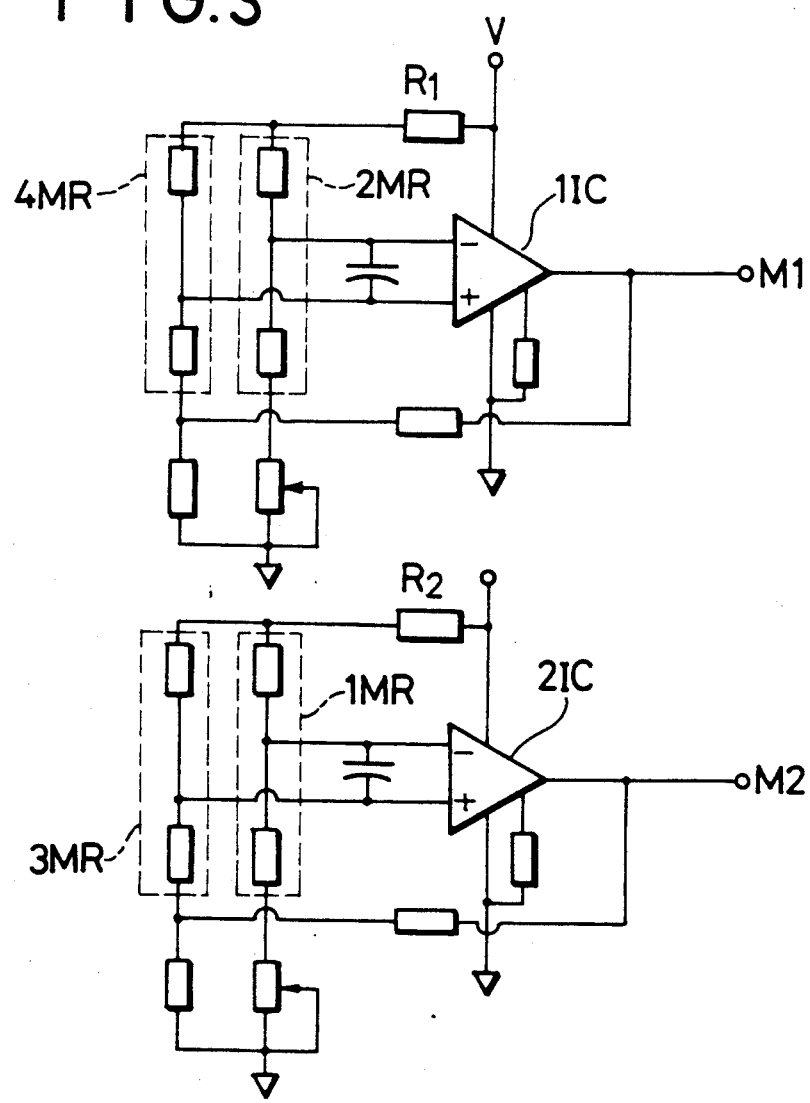
FIG. 3 is a circuit diagram of a waveform shaping circuit 10 of a magnetic encoder.
Figure 4:
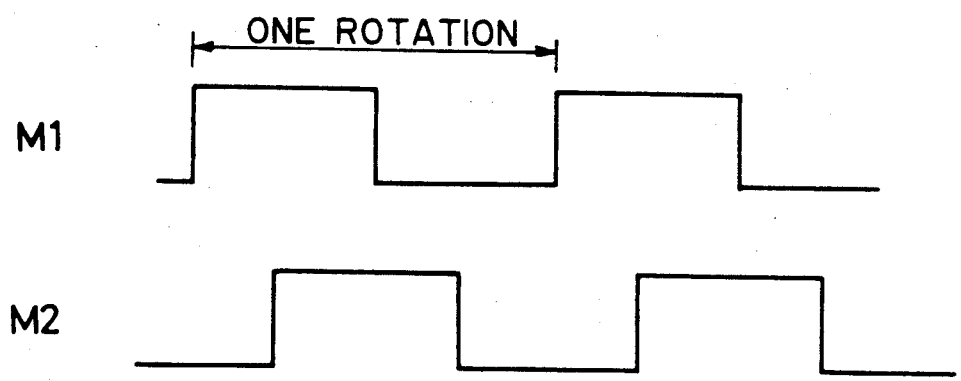
FIG. 4 is a waveform diagram of output pulses $M_1$ and $M_2$ of the waveform shaping circuit 10.

FIG. 3 is a circuit diagram of a waveform shaping circuit of the magnetic encoder. FIG. 4 is a waveform diagram of output pulses $M_1$ and $M_2$ of this circuit. As will be understood from the diagrams, the pulse $M_1$ ($M_2$) is obtained by detecting the differential output of magnetoresistive element 2MR and 4MR (1MR and 3MR). The waveforms are shaped by programmable operational amplifiers 1IC and 2IC whose electric power consumption is very small. To reduce the electric power consumption, magnetoresistive element 1MR to 4MR having high resistances of hundreds of kiloohms are used. Further, resistors $R_1$ and $R_2$ of high resistances are serially connected. In this way, the electric power consumption of the whole circuit is reduced, thereby prolonging the life of the battery. In the control circuit 12 as well, not only a CMOS type microcomputer but also CMOS type control devices are used to minimize the current consumed. Thus, low current consumption is realized and, when the circuit is in the inoperative mode, current consumption is about 10 μA. In addition, since the high volumed capacitor 15 is used, if the high volumed capacitor of 2 (F) is used as the capacitor 15, the circuit can operate for 100 hours or longer even if the power source or battery power source is cut. Therefore, even if the robot is moved for four days or more due to a production line change in a factory, the absolute value is held, so that the robot can be immediately restarted.

Light emitting device section of the absolute encoder

Figure 10:
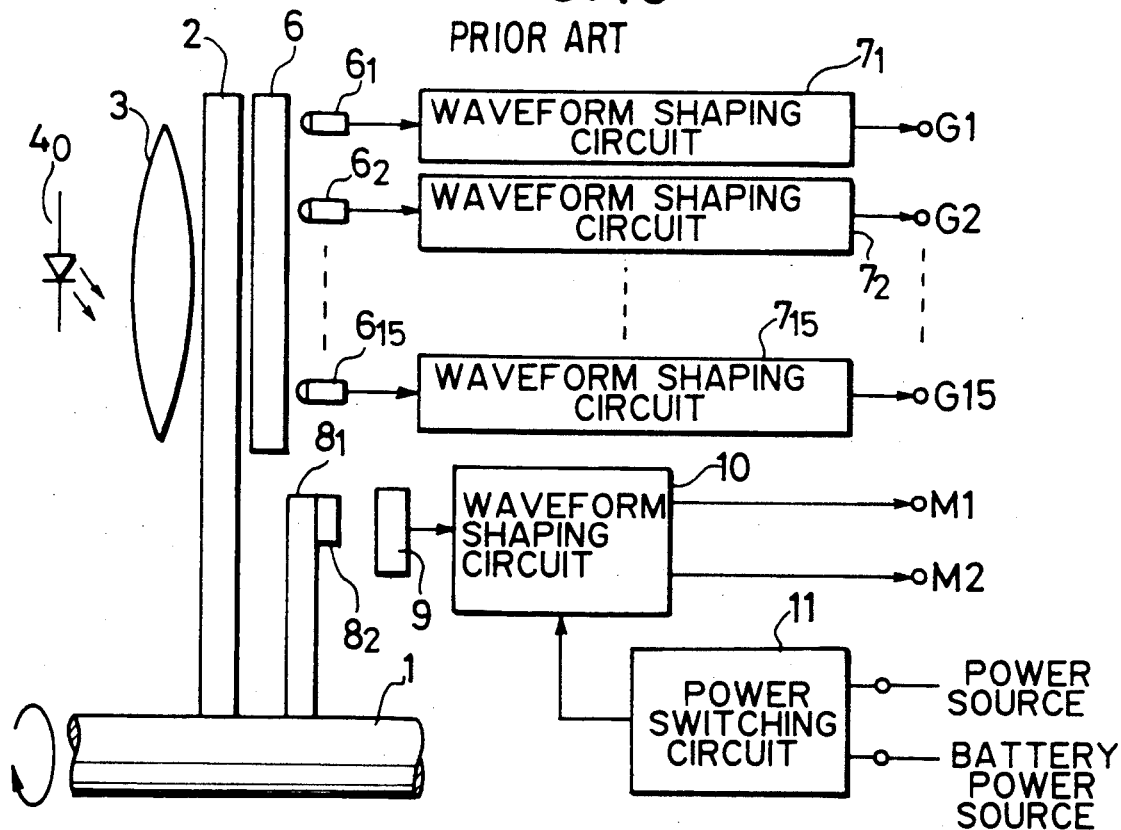
FIG. 10 is a diagram showing a constitution of a conventional multirotation type absolute encoder.
Figure 11:
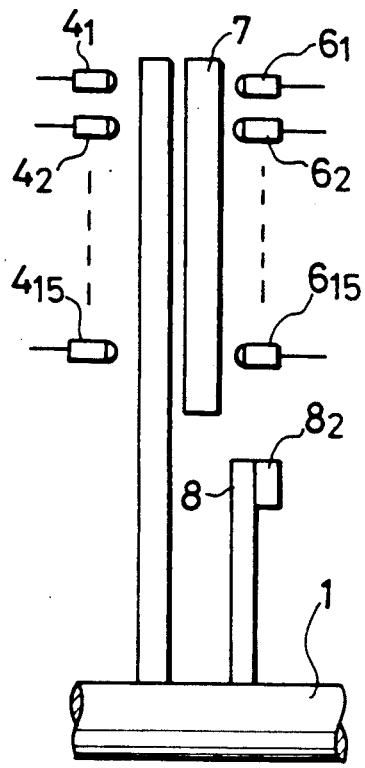
FIG. 11 is a diagram showing the main section of another conventional multirotation type absolute encoder.

LED are used as the light emitting device. However, the conventional methods described in FIGS. 10 and 11 have problems. Therefore, in the case of 15 bits as shown in FIG. 1, three LEDs 4 are used, the light emitting positions are grouped and the grouped LEDs emit light. On the other hand, in the case of grouping, if the light emitted from the central and peripheral light emitting positions are not parallel, an accurate detection signal cannot be obtained. Therefore, an aspheric lens is used in the lens section to thereby obtain parallel light. Since it is sufficient to use parallel light and to emit light from each group, a small lens can be used in the LED. Thus, since the light emitting source has a short focal distance, the encoder is shortened.

Pattern constitution of the absolute encoder

Figure 5:
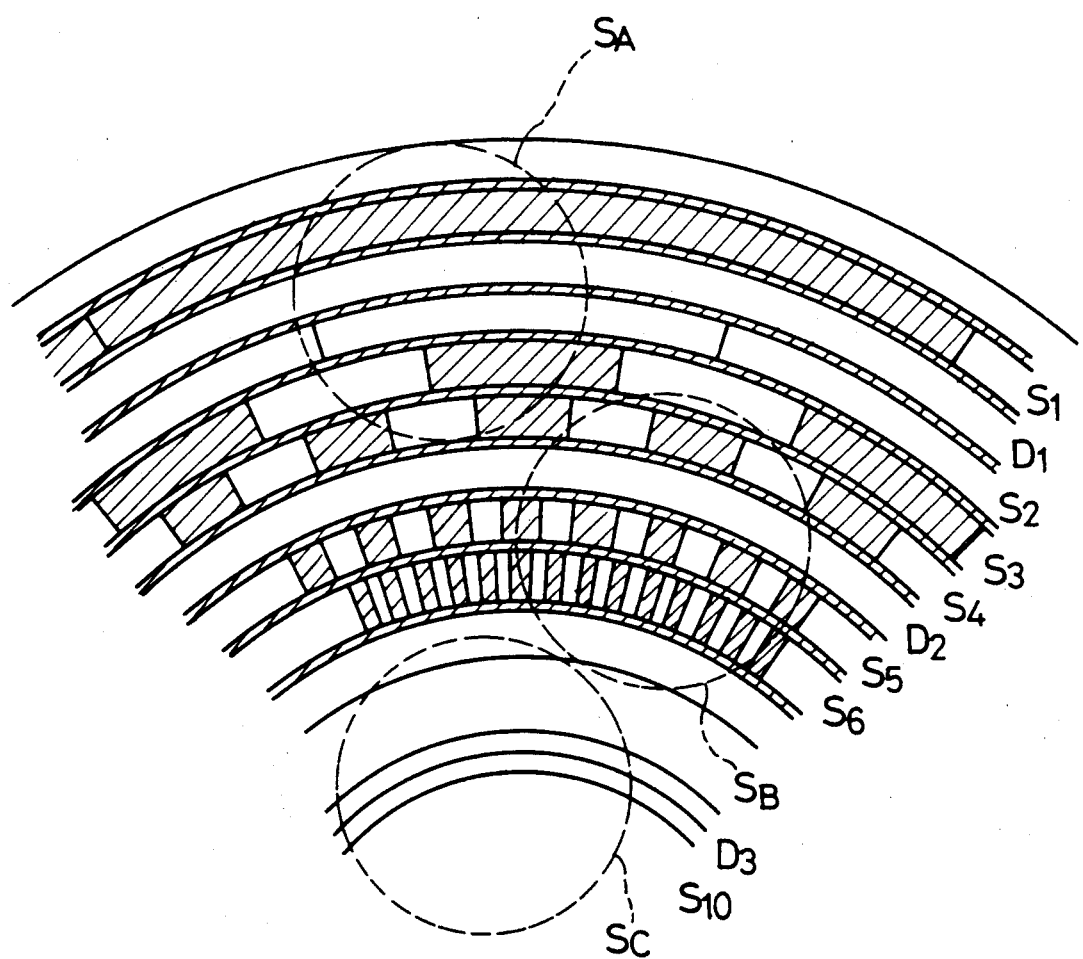
FIG. 5 is a diagram showing patterns of an absolute encoder.
Figure 6:
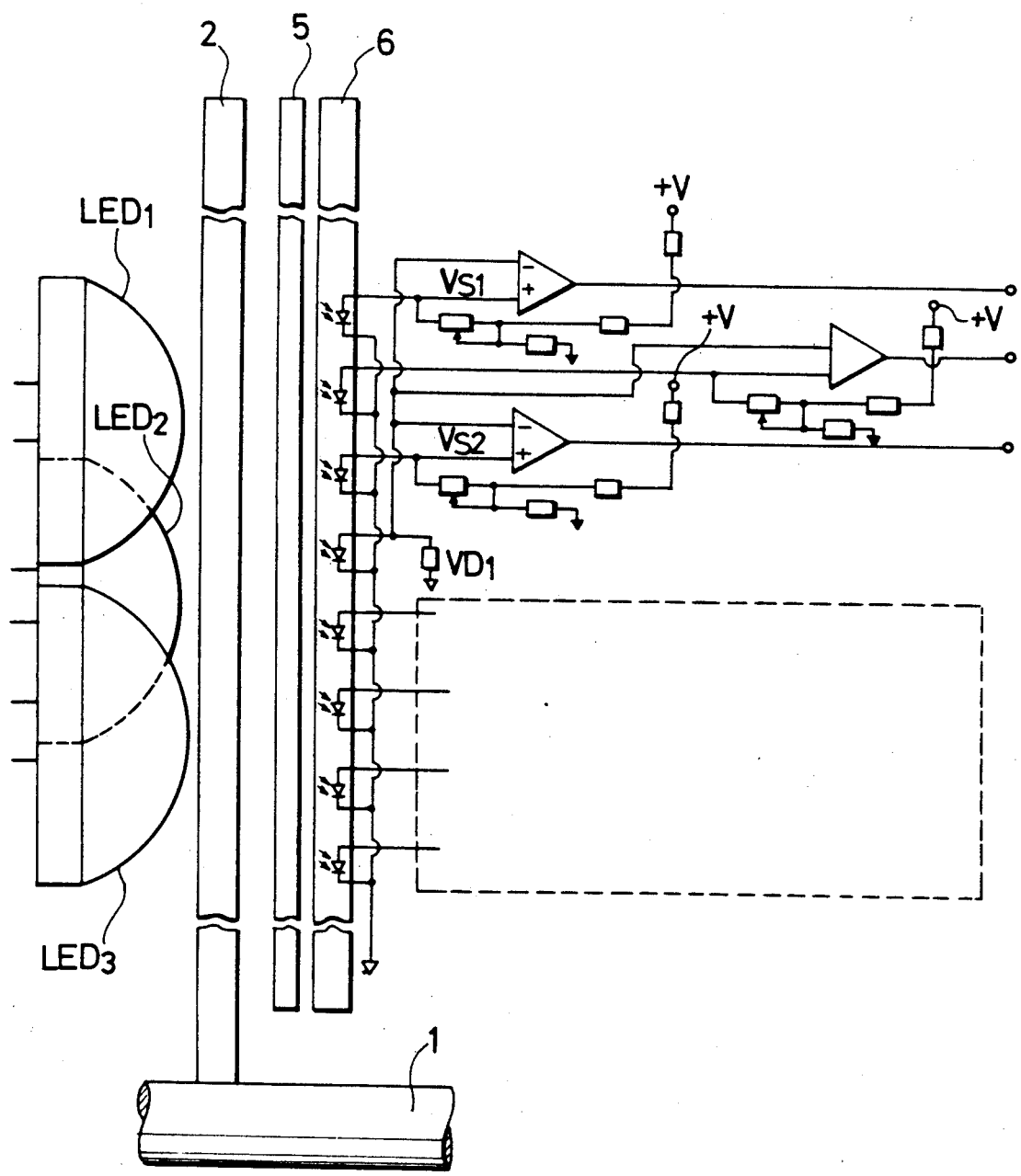
FIG. 6 is an enlarged diagram of a portion of the absolute encoder of FIG. 1.
Figure 12:
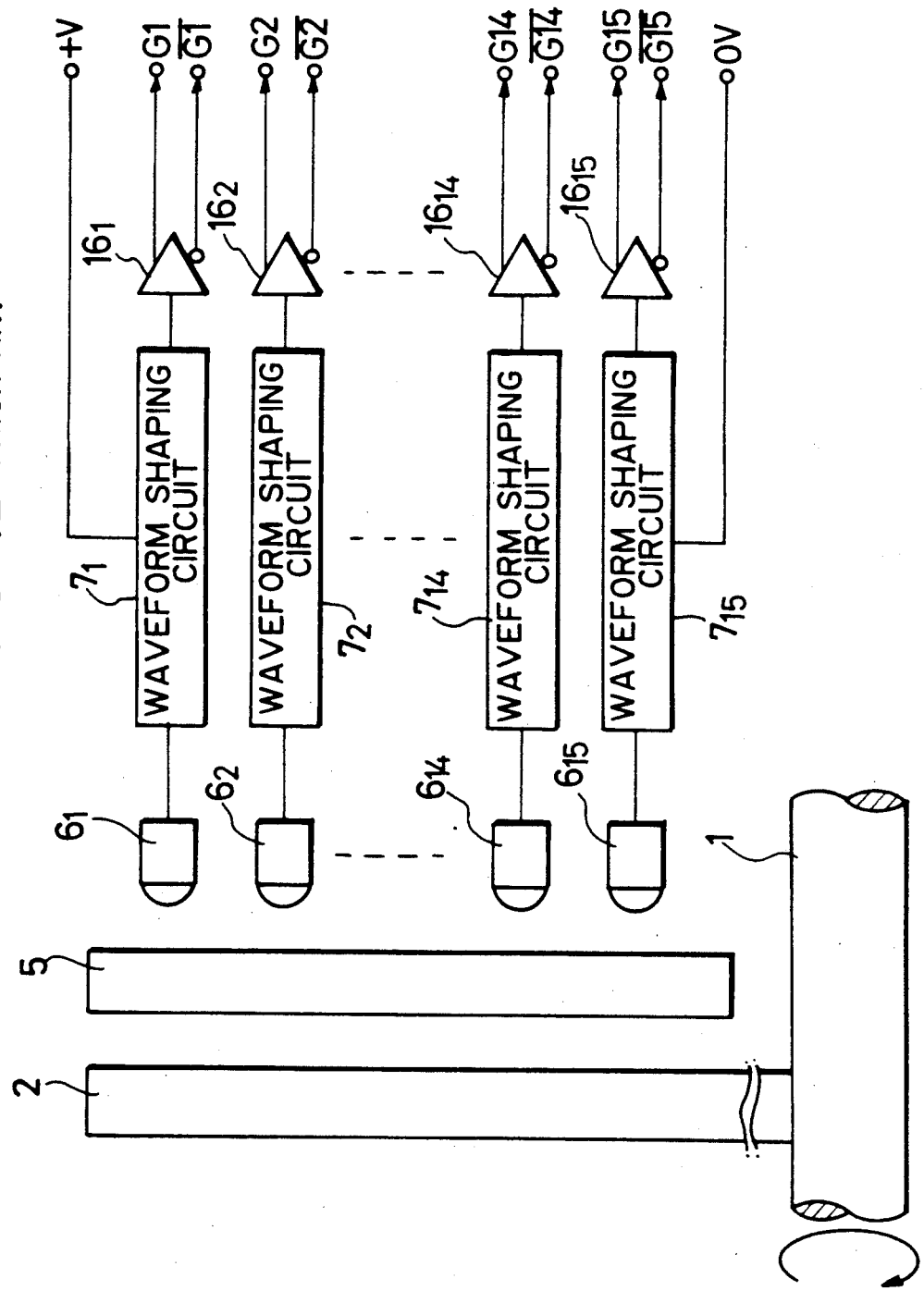
FIG. 12 is a diagram showing a constitution of a conventional multirotation type absolute encoder using balanced line driver.

FIG. 5 is a diagram showing a pattern of the absolute encoder. FIG. 6 is a circuit diagram of a portion of the absolute encoder in FIG. 1. To eliminate the drawback due to variations in light emitting devices and photo sensing devices shown in FIGS. 11 and 12, the pattern of the absolute encoder is divided into three groups as described above. In the groups, transparent reference tracks $D_1$, $D_2$, and $D_3$ are provided as shown in FIG. 5. A one-chip silicon photodiode array is used as a photo sensing devices 6. In FIG. 5, circles $S_A$, $S_B$, and $S_C$ indicated by broken lines show areas where light emitting diodes $LED_1$, $LED_2$, and $LED_3$ (corresponding to three LEDs 4 each having an aspheric lens in FIG. 1) emit light. With this constitution, since the photo sensing devices are formed on the same silicon wafer, the temperature characteristics of the photodiodes are fairly 0 uniform. Therefore, by comparing the detection signal $V_{S1}$ of a slit $S_1$ with a index signal $V_{D1}$ derived from the reference track and by shaping the waveforms of these signals as shown in FIG. 6, the temperatures of the LEDs and photodiodes simultaneously change and the waveforms are shaped at this differential voltage, so that an output waveform which is extremely stable to the temperature can be obtained. By using one slit of the magnetic encoder as the minimum slit (MSB) of the absolute encoder, there is no need to form a slit in the absolute encoder section. Therefore, the number of tracks in the absolute encoder section decreases and the encoder can be miniaturized radically.

Waveform shaping circuit section of the absolute encoder

Two kinds of constitutions are used for the waveform shaping circuits $7_1$ to $7_{15}$ of the absolute encoder in accordance with the number of bits of the gray code. As described above, there is the problem that the conventional absolute encoder cannot be used at a high rotational speed because the frequqncy characteristics of the respective bits differ. However, according to these constitutions, the absolute value signals are serially transmitted when the rotation is stopped and thereafter, the signals are sent by incremental signals in a manner similar to the conventional method. Therefore, no problem is caused even if the shaft is rotated at a high speed.

Figure 7:
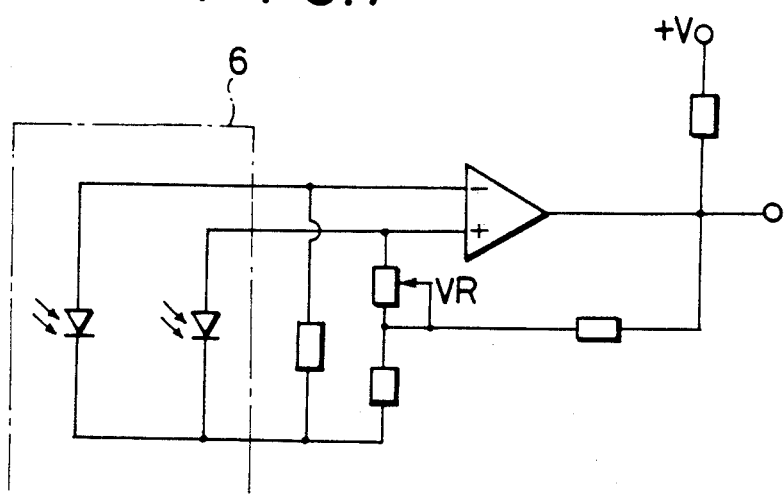
FIG. 7 is a diagram showing the circuit section in FIG. 6 corresponding to only one slit.

FIG. 7 shows a circuit in the circuit section in FIG. 6 corresponding to only one slit. This circuit is used in the waveform shaping circuit of two or more slits excluding the maximum slit of a high resolution. The magnitude of signal level of each slit is adjusted by a variable resistor VR. Since the frequency characteristics of the photodiode deteriorate as the load resistance increases, the characteristics of the slit in which the signal output is small and the variable resistor VR is largely adjusted deteriorate. However, since the absolute value is detected when the rotation is stopped, as described above, the characteristics of the encoder are not influenced by variations in signal level.

Figure 8:
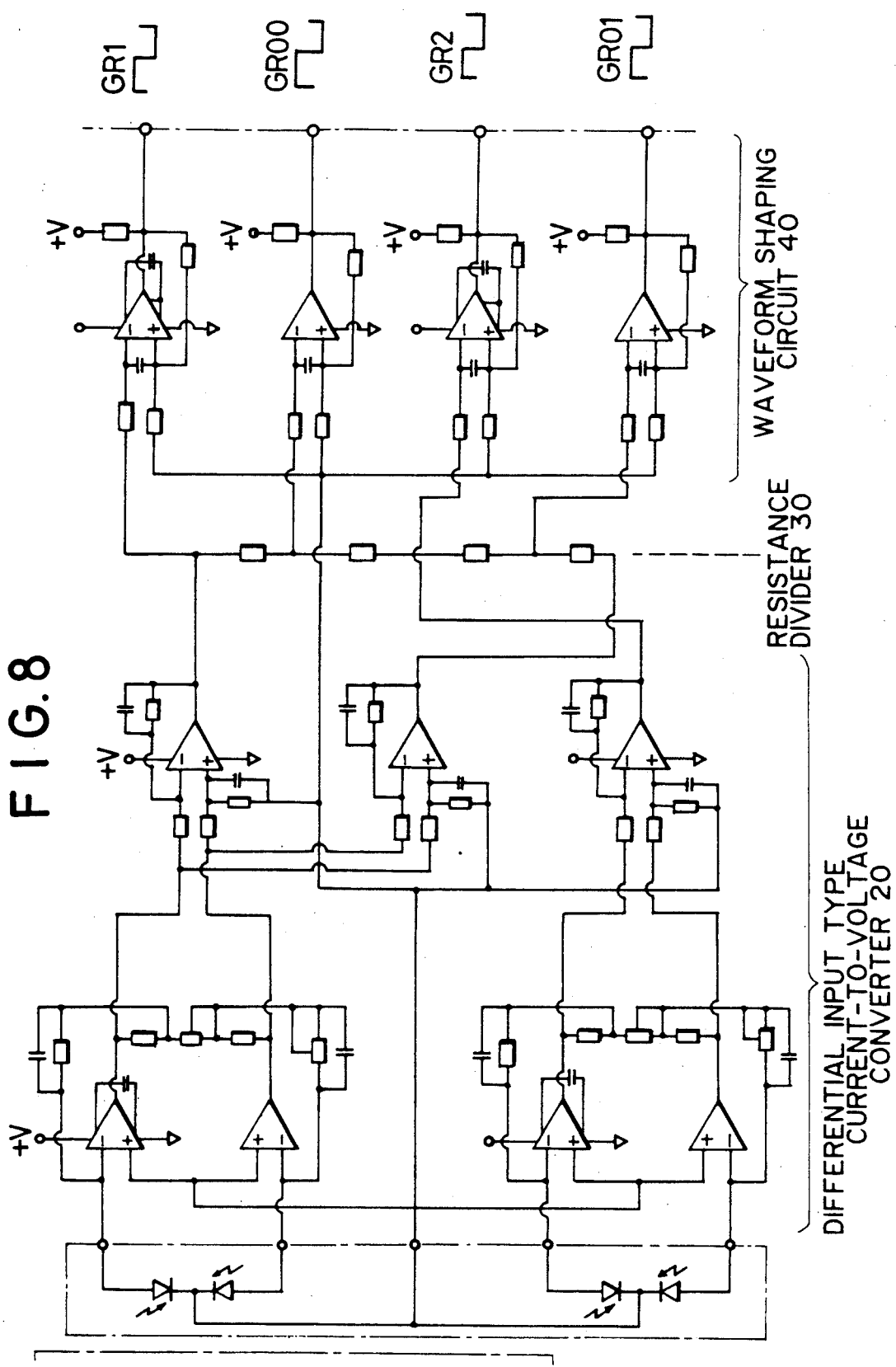
FIG. 8 is a circuit diagram to output 15 bits, i.e., 32,768 pulses.

FIG. 8 is a circuit diagram to output 32,768 pulses of 15 bits. In this embodiment, in order to reduce the number of tracks of the disk 2 to detect the absolute value, 4096 slits are used as the slit of the highest resolution (in general, 8192 slits are used). The signals detected by these slits are input to a differential input type current-to-voltage converter 20 to thereby obtain quasi-sinusoidal signals of 4096 slits. From these signals, quasi-sinusoidal signals whose phases are different by 45° at a time are obtained through a resistance divider 30. The waveforms of these signals are shaped by a waveform shaping circuit 40, thereby obtaining square wave signals.

FIG. 9 is a diagram showing the phase relations among square wave outputs $GR_1$, $GR_{00}$, $GR_2$, and $GR_{01}$ in FIG. 8.

Figure 9A:
FIGS. 9A–9K are diagram showing the phase relation of square wave output signals.
Figure 9B:
Figure 9C:
Figure 9D:
Figure 9E:
Figure 9F:
Figure 9G:
Figure 9H:
Figure 9I:
Figure 9J:
Figure 9K:
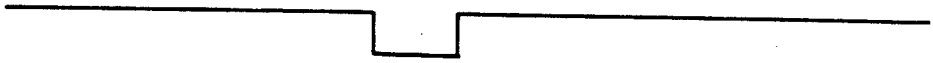

The outputs $GR_1$, $GR_{00}$, $GR_2$, and $GR_{01}$ (each consisting of 4096 pulses) are shown in FIG. 9B, 9D, 9C, and 9E, respectively. The outputs $GR_1$, and $GR_2$ and the outputs $GR_{00}$ and $GR_{01}$ are input to exclusive OR circuits (not shown) in the control circuit 17, so that square wave output signals of two phases (of channels A and B) of 8192 pulses shown in FIG. 9H and in FIG. 9I are obtained. FIGS. 9J and 9K show signals of channels Z and $\overline{Z}$, respectively. It is known that the frequency characteristic of a diode varies with the value of its load resistance, and is optimal when the value is zero, i.e., when the diode is short. Therefore, it is possible in principle to make the value zero by using a current-to-voltage converter. Further, it is possible to cancel common mode noise. For these reasons, a differential input type current-to-voltage converter 20 is used, whereby the frequency characteristics are also improved. Even if the shaft is rotated at a high speed, the characteristics can be sufficiently satisfied.

The embodiment of FIG. 1 relates to the example in which one index pulse (channels Z and $\overline{Z}$) per rotation is added. Since the absolute value can be inherently detected, the index pulse which is used in the conventional incremental encoder is unnecessary. In this embodiment, index pulses are synthesized by the control circuit 17 and sent to the external controller. By always checking the number of pulses, a malfunction can be detected by the noise appearing during transmission. The reliability can be improved as follows. Since only one pulse of channel Z is output per rotation as compared with channels A and B, the probability that the noise is mixed with the pulse of channel Z is small, so that when the pulses of channels A and B are counted, if the encoder is operated while always checking the number of pulses of channel Z, the pulses can be transmitted with improved high reliability.

While the present invention has been described above with respect to several preferred embodiments thereof, it should of course be understood that it need not be limited only to them, but that various modifications and variations may be made in a suitable manner within the spirit and scope of the invention as defined by the appended claims.

What is claimed is:

1. A rotation type absolute encoder in which a magnetic type one-pulse encoder for detecting the number of rotations and the direction of rotation and an optical type absolute encoder for detecting an absolute angle within one rotation are combined on the same shaft, the absolute angle of rotations of said shaft is detected on the basis of detection signals of said encoders, and when a current which is supplied to said encoders is cut, a current is supplied from an external auxiliary power source to said one-pulse encoder and to an electronic circuit to measure the detection amount of the one-pulse encoder comprising:

a power source voltage detecting circuit for detecting whether the power source voltage has reached a predetermined voltage value when the power source is turned on; and a control circuit for first serially transmitting a signal indicating the number of rotations to an external controller when the power source voltage has reached the predetermined voltage or more and, thereafter, for transmitting a signal indicating the absolute angle within one rotation by square wave signals of two phases having a phase difference of 90°.

2. A rotation type absolute encoder in which a magnetic type one-pulse encoder for detecting the number of rotations and the direction of rotation and an optical type absolute encoder for detecting an absolute angle within one rotation are combined on the same shaft, the absolute angle of rotations of said shaft is detected on the basis of detection signals of said encoders, and when a current which is supplied to said encoders is cut, a current is supplied from an external auxiliary power source to said one-pulse encoder and to an electronic circuit to measure the detection amount of the one-pulse encoder comprising:

a disk with slit tracks where each of said slit tracks of said optical type absolute encoder is divided into a group corresponding to an area to which a LED can emit light, and wherein a reference track having a transparent portion is provided in said group, and the detection signals are converted into a square wave output by using the output signal of said reference track as an index.

3. A rotation type absolute value encoder according to claim 2, wherein an LED is used as a light source of said optical type absolute encoder, and an aspheric lens is used as a condenser lens.

4. A rotation type absolute encoder in which a magnetic type one-pulse encoder, for detecting the number of rotations and the direction of rotation and an optical type absolute encoder for detecting an absolute angle within one rotation are combined on the same shaft, the absolute angle of rotations of said shaft is detected on the basis of detection signals of said encoders, and when a current which is supplied to said encoders is cut, a current is supplied from an external auxiliary power source to said one-pulse encoder and to an electronic circuit to measure the detection amount of the one-pulse encoder comprising:

a differential input current-to-voltage converter for detecting signals from a track of the maximum resolution and for outputting sinusoidal signals to the waveform shaping circuits.

5. A rotation type absolute encoder in which a magnetic type one-pulse encoder for detecting the number of rotations and the direction of rotation and an optical type absolute encoder for detecting an absolute angle within one rotation are combined one the same shaft, the absolute angle of rotations of the shaft is detected on the basis of detection signals of said encoders, and when a current which is supplied to said encoders is cut, a current is supplied from an external auxiliary power source to said one-pulse encoder and to an electronic circuit to measure the detection amount of the one-pulse encoder comprising:

a control circuit for synthesizing and outputting one reference pulse per rotation from the detection signal of said magnetic type one-pulse encoder and from the detection signal of said optical type absolute encoder.

6. A rotation type absolute encoder in which a magnetic type one-pulse encoder, for detecting the number of rotations in the direction of rotation and an optical type absolute encoder for detecting an absolute angle within one rotation are combined on the same shaft, the absolute angle of rotations of said shaft is detected on the basis of detection signals of said encoders, and when a current which is supplied to said encoder is cut, a current is supplied form an external auxiliary power source to said one-pulse encoder and to an electronic circuit to measure the detection amount of the one pulse encoder comprising:

an optical type absolute encoder with a rotary disk devoid of a minimum salt (MSB) corresponding to a one-pulse detection; and a magnetic encoder for detecting a one-pulse, in place of a pulse detected from the devoid minimum slit.

* * * * *